United States Patent
Tsuji

(10) Patent No.: US 7,064,806 B2
(45) Date of Patent: Jun. 20, 2006

(54) ILLUMINATION OPTICAL SYSTEM AND EXPOSURE APPARATUS

(75) Inventor: Toshihiko Tsuji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 10/768,896

(22) Filed: Jan. 30, 2004

(65) Prior Publication Data
US 2005/0057737 A1 Mar. 17, 2005

(30) Foreign Application Priority Data
Sep. 17, 2003 (JP) ............................. 2003-324639

(51) Int. Cl.
G03B 27/54 (2006.01)
G03B 27/72 (2006.01)
(52) U.S. Cl. .......................................... 355/67; 355/71
(58) Field of Classification Search .................. 355/53, 355/67, 71; 362/268, 317, 341; 378/34, 378/84, 210; 359/618, 619; 430/5
See application file for complete search history.

(56) References Cited

U.S. PATENT DOCUMENTS

| 5,677,939 | A | 10/1997 | Oshino ........................ 378/34 |
| 5,995,582 | A | 11/1999 | Terashima et al. ............ 378/34 |
| 6,452,661 | B1 | 9/2002 | Komatsuda .................. 355/67 |
| 6,504,896 | B1 | 1/2003 | Miyake et al. ................ 378/34 |
| 6,860,610 | B1* | 3/2005 | Terasawa ..................... 359/857 |
| 2002/0054660 | A1* | 5/2002 | Komatsuda et al. .......... 378/34 |
| 2003/0031017 | A1* | 2/2003 | Tsuji ........................... 362/268 |
| 2003/0142322 | A1* | 7/2003 | Sato ............................ 356/515 |

FOREIGN PATENT DOCUMENTS

| JP | 7-235472 | A | 9/1995 |
| JP | 10-70058 | A | 3/1998 |
| JP | 11-312638 | A | 11/1999 |
| JP | 2003-45774 | A | 2/2003 |
| JP | 2003-45784 | A | 2/2003 |
| JP | 2003-506747 | A | 2/2003 |
| WO | 01/09681 | A2 | 2/2001 |
| WO | 01/09681 | A3 | 2/2001 |

* cited by examiner

Primary Examiner—W. B. Perkey
Assistant Examiner—Vivian Nelson
(74) Attorney, Agent, or Firm—Morgan & Finnegan, L.L.P.

(57) ABSTRACT

An exposure apparatus includes an illumination optical system for illuminating a reflection mask that forms a pattern, by using light from a light source, wherein the illumination optical system includes a field stop that defines an illuminated area on the reflection mask, and has an opening, and an imaging system for introducing the light from the opening in the field stop into the reflection mask, the imaging system being a coaxial optical system, wherein a principal ray of the imaging system at a side of the reflection mask forming an inclination angle to a common axis of the coaxial optical system, the inclination angle being approximately equal to an angle between a principal ray of the projection optical system at the side of the reflection mask and a normal to a surface of the reflection mask.

18 Claims, 16 Drawing Sheets

ILLUMINATION OPTICAL SYSTEM AND EXPOSURE APPARATUS

This application claims a benefit of priority based on Japanese Patent Application No. 2003-324639, filed on Sep. 17, 2003, which is hereby incorporated by reference herein in its entirety as if fully set forth herein.

BACKGROUND OF THE INVENTION

The present invention relates generally to an exposure apparatus, and more particularly to an exposure apparatus that uses a light source in an extreme ultraviolet ("EUV") or X-ray region with a wavelength between 10 nm and 200 nm to expose an object, such as a single crystal substrate for a semiconductor wafer, and a glass plate for a liquid crystal display ("LCD").

A reduction projection exposure method that uses, for example, EUV light or X-ray have been proposed as one of methods for manufacturing semiconductor circuit devices having a fine pattern (see, for example, Japanese Patent Application Publication No. 10-70058 (or its U.S. counterpart, U.S. Pat. No. 6,504,896B1), Japanese Patent Application Publication No. 2003-045774 (or its U.S. counterpart, U.S. Patent Application Publication No. 2003031017A1), and Japanese Patent Application Publication No. 2003-045784 (or its U.S. counterpart, U.S. Patent Application Publication No. 2003031017A1)

This method uses the EUV light to illuminate a mask (or a reticle) that forms a circuit pattern, and projects a reduced size of the pattern on the mask, onto a wafer surface, and to expose photoresist on the wafer surface for pattern transfer.

FIG. 12 schematically shows principal part of a conventional EUV reduction projection exposure apparatus 1000. In FIG. 12, 1001 denotes an EUV light emission point, 1002 denotes EUV light, 1003 denotes a filter, 1004 denotes a first rotational paraboloid mirror, 1005 denotes a reflection integrator, 1006 denotes a second rotational paraboloid mirror, 1007 denotes a reflection mask, 1008 denotes plural mirrors that constitute a projection optical system, 1009 denotes a wafer, 1010 denotes a mask stage, 1011 denotes a wafer stage, 1012 denotes an arc aperture, 1013 denotes a laser light source, 1014 denotes a laser condensing optical system, and 1017 denotes a vacuum chamber. FIG. 14 is a plane view showing a relationship between an illuminated area 1015 on the mask 1007 and an arc area 1016 to be exposed.

The exposure apparatus 1000 thus includes a light source section 1013, 1014 that generates the EUV light, an illumination optical system (i.e., the first rotational paraboloid mirror 1004, the reflection integrator 1005 and the second rotational paraboloid mirror 1006), the reflection mask 1007, the projection optical system that is comprised of plural mirrors 1008, the wafer 1009, the mask mounted stage 1010, the wafer mounted stage 1011, an alignment mechanism (not shown) for precise alignment between mask and wafer positions, the vacuum chamber 1017 that maintains vacuum of the entire optical system vacuum for reduced attenuations of the EUV light, and an exhaust apparatus (not shown).

The illumination optical system uses the first rotational paraboloid mirror 1004 to condense the EUV light 1002 from the emission point 1001 into the reflection integrator 1005 so as to form secondary light sources, and uses the second rotational paraboloid mirror 1006 to superimpose and condense the EUV light from these secondary light sources so as to uniformly illuminate the mask 1007.

The reflection mask 1007 forms a pattern to be transferred, using a non-reflected part made of an EUV absorber on a multilayer mirror. The projection optical system that is comprised of plural mirrors 1008 images, on the wafer 1009, the EUV light that has information of a circuit pattern reflected by the reflection mask 1007.

The projection optical system that is comprised of plural mirrors 1008 is configured to have excellent imaging performance in an off-axis, thin arc area (i.e., apart from an optical-axis center). The aperture 1012 with the arc opening just prior to the wafer 1009 enables exposure to use only this thin arc area. The exposure scans the reflection mask 1007 and the wafer 1009 simultaneously and transfers a rectangular shot on the entire surface of the mask.

The projection optical system that is comprised of plural mirrors 1008, which are multilayer mirrors, is configured to project a reduced size of pattern on the mask 1007 onto the wafer 1009 surface. The projection optical system that is comprised of plural mirrors 1008 typically forms an image-side telecentric system, and usually provides an object side (or the reflection mask side) with a non-telecentric structure so as to avoid physical interference with the illumination light incident upon the reflection mask 1007.

The laser condensing optical system 1014 condenses a laser beam from the laser light source 1013 onto a target (not shown) at the emission point 1001, generating a high-temperature plasma light source 1001. The EUV light 1002 thermally radiated from this plasma light source is reflected on the first rotational paraboloid mirror 1004 and turns into parallel EUV light. This light is reflected on the reflection integrator 1005 and forms a multiplicity of secondary light sources.

The EUV light from these secondary light sources is reflected on the second rotational paraboloid mirror 1006 and illuminates the reflection mask 1007. Distances from the secondary light sources to the second rotational paraboloid mirror 1006 and from the secondary rotational paraboloid mirror 1006 to the reflection mask 1007 are set to be equal to a focal distance of the second rotational paraboloid mirror 1006.

Since a focal point of the second rotational paraboloid mirror 1006 is located at positions of the second light sources, the EUV light emitted from the secondary light sources irradiates as parallel light the reflection mask 1007. The projection optical system that is comprised of plural mirrors 1008 is configured to project an image of the secondary light sources onto an entrance pupil surface, and thereby meets the Kohler's illumination conditions. The EUV light that illuminates one point on the reflection mask 1007 is superimposed EUV beams emitted from all the secondary light sources.

The illuminated area 1015 on the mask surface is similar, as shown in FIG. 13, to a plane shape of a concave or convex mirror as an element in the reflection integrator 1005, and it is an approximately rectangular shape that includes the arc shape 1016 to be actually exposed. The projection optical system that is comprised of plural mirrors 1008 is configured to project an image of the secondary light sources onto its pupil surface.

However, the conventional EUV reduction projection exposure apparatus has been disadvantageous, because the aperture 1012 that defines an illuminated area is provided near the wafer 1009 and should be somewhat apart from the driving wafer during exposure. This separation defocuses the exposure area.

It is conceivable to provide a similar aperture near the reflection mask 1007, but the same problem occurs. The problem would be serious because the similar aperture should be located near the reflection mask 1007 so that it does not shield necessary light incident upon and exiting from the reflection mask.

It is also conceivable to provide an imaging system between a reticle and an aperture for defining the illuminated area, its detailed structure has not been conventionally clarified.

BRIEF SUMMARY OF THE INVENTION

Accordingly, with the foregoing conventional problems in mind, it is an exemplary object of the present invention to provide an exposure apparatus, which clarifies an imaging system between an reticle and an aperture for defining an illuminated area, and includes an illumination optical system that has the imaging system.

In order to achieve the above object, an exposure apparatus of one aspect according to the present invention includes an illumination optical system for illuminating a pattern of a reflection mask, by using light from a light source, wherein the illumination optical system includes a field stop that defines an illuminated area on the reflection mask, and has an opening, and an imaging system for directing the light from the opening in the field stop into the reflection mask, the imaging system being a coaxial optical system, and a projection optical system for projecting the pattern on the reflection mask onto a substrate, wherein a principal ray of the imaging system at a side of the reflection mask forming an inclination angle to a common axis of the coaxial optical system, the inclination angle being approximately equal to an angle between a principal ray of the projection optical system at the side of the reflection mask and a normal to a surface of the reflection mask.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
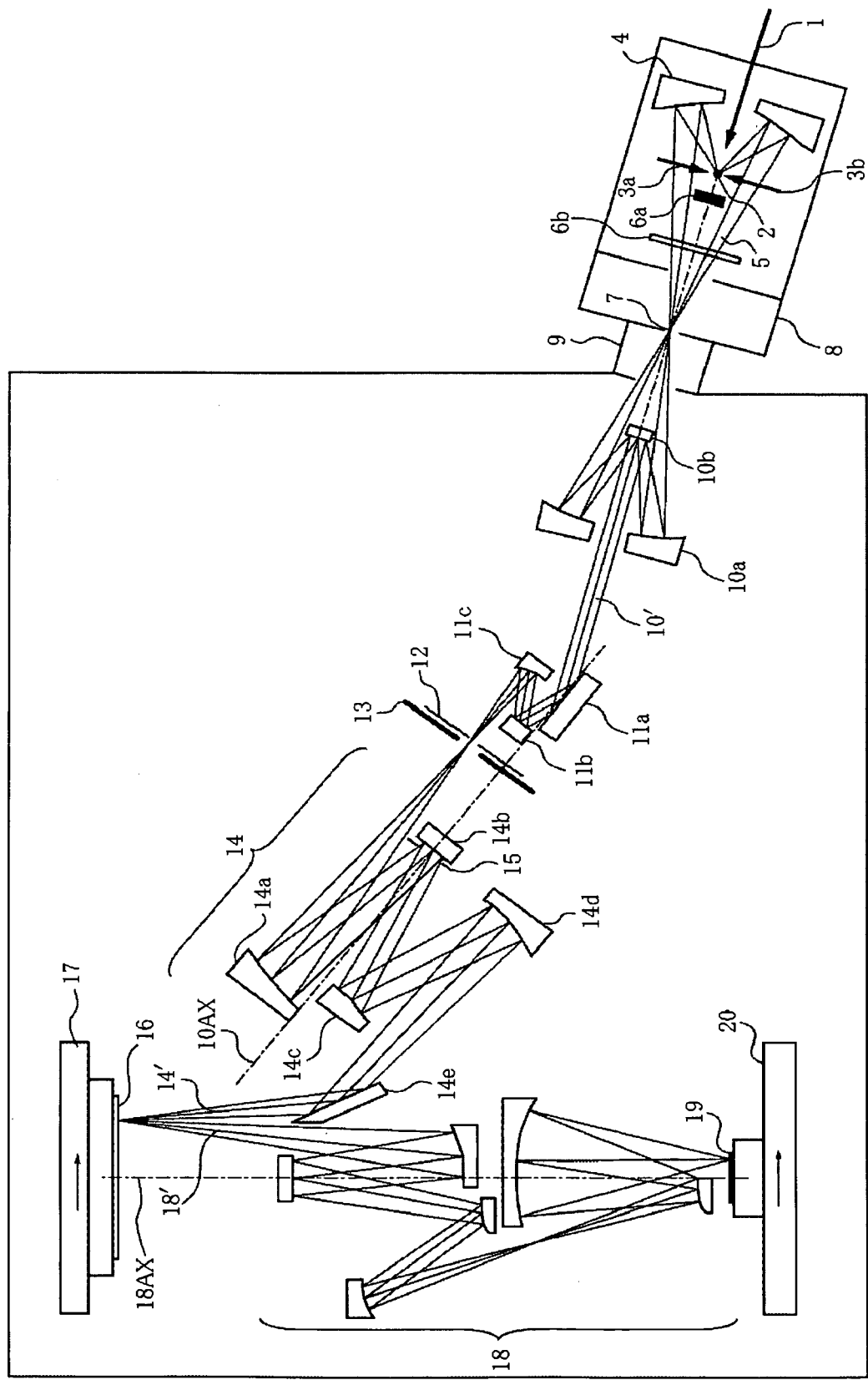
FIG. 1 is a schematic view of an embodiment according to the present invention.

FIG. 1 is a schematic view of an embodiment according to the present invention. As illustrated, 1 denotes an excitation laser beam. 2 denotes a plasma emission point. 3a denotes a nozzle that injects a liquid drop as a target for plasma generations, and 3b denotes a liquid-drop recovery part for recovering and recycling liquid drops that have not received excitation laser beam. 4 denotes a condenser mirror that receives light emitted from the plasma emission point. 6a denotes a filter that removes flying particles (or debris) from the plasma, and 6b denotes a wavelength filter that removes light other than the EUV light. 7 denotes a pinhole aperture arranged at or near the condensed point of the condenser mirror 4. 8 denotes a vacuum chamber that accommodates the plasma light source. These elements constitute a light source section. 5 denotes the EUV light condensed by the mirror 4. 9 denotes a connector that connects an exposure apparatus body to a plasma light source section in a vacuum state.

10a and 10b are part of a parallelizing optical system that receives the EUV light through the aperture 7, converts it into parallel light, and includes a concave mirror and a convex mirror. 11a is an integrator having plural cylindrical mirrors, and 11b and 11c are part of an optical system that includes a rotational paraboloid mirror for condensing the light from the integrator 11a into an arc shape. 12, 13 constitute a slit system (or a field stop) wherein 12 denotes a slit that has an arc opening and a partially variable width. 13 denotes a masking blade for restricting the illumination light to a desired exposed area, located on a surface conjugate to the reflection mask 16. 14 denotes a masking imaging system that images at a desired magnification with respect to the masking blade 13 as the object side and the reflection mask 16 as the image side, and forms an arc illuminated area on the reflection mask. 14a, 14b, 14c and 14d, respectively, denote a curved mirror in the masking imaging system 14, and 14e is a, plane mirror that reflects light from the imaging system 14 to 14d to reflect the image-side light 14' of the masking imaging system 14 for entry into the reflection mask 16 at a predetermined angle. 15 denotes an aperture stop located at a pupil surface in the masking imaging system 14a to 14d. These elements constitute an illumination optical system for illuminating the reflection mask 16 with light from the light source section.

17 denotes a mask stage that holds the reflection mask 16. 18 denotes a projection optical system that includes plural mirrors, forms a coaxial optical system, and provides an object side with non-telecentricity and an image side with telecentricity. 19 denotes a wafer that applies a photosensitive material. 20 denotes a wafer stage that holds the wafer 19, and 21 denotes a vacuum chamber that maintains the entire optical system in the vacuum atmosphere for reduced attenuation of the EUV light.

The high power excitation pulse laser beam 1, emitted from the excitation laser part that includes an excitation laser light source and condenser optical system (not shown), is configured to condense at a position of the emission point 2, and forms a plasma light source section. The liquid drop as the target of this laser plasma light source, such as Xe, is configured to be continuously injected at regular time intervals from the nozzle 3a, and pass the condensed point 2. When the thus-injected liquid drop is located at the position of the element 2, the excitation pulse laser beam 1 irradiates liquid drops to generate the high-temperature plasma from the emission point 2, and the thermal radiation from this plasma generates the EUV light.

While the instant embodiment uses Xe liquid drops as a target, the target may use Xe gas injected into a vacuum, a cluster generated from an adiabatic expansion, solidified Xe gas that has been cooled on the metal surface, and a metal tape, such as Cu. Alternatively, the EUV light source can use an undulator, or a so-called discharge method, such as Z pinch method, a plasma focus, a capillary discharge, and hollow cathode triggered Z pinch.

The EUV light irradiated from the plasma emission point 2 is condensed by the condenser mirror 4, such as a rotational spheroid mirror, and taken out as a EUV beam. The filter 6a removes flying particles (or debris) that fly ahead directly from the plasma and its vicinity, and the filter 6b removes an unnecessary wavelength component for the EUV exposure, as required. Then, the light is condensed into the pinhole aperture 7 provided on a boundary surface between the vacuum chamber 8 that accommodates the plasma light source, and the vacuum chamber 21 that accommodates the exposure apparatus body. The connector 9 connects the vacuum chamber 8 that accommodates the light source to the vacuum chamber 21 that accommodates the exposure apparatus body.

The EUV light 5 that has passed through the aperture 7 is converted into approximately parallel light 10' by the parallelizing optical system that includes a concave mirror 10a that has an opening at its center, and a convex mirror 10b that has a smaller diameter than the concave mirror 10a. Here, the concave mirror 10a has an opening for light reflected by the convex mirror 10b, and its opening is located on the optical axis of the EUV light from the light source. These mirrors 10a and 10b have a reflective surface of approximately rotational symmetry with respect to the optical axis of the EUV light from the light source. The center axis approximately accords with the optical axis of the EUV light.

The above condenser mirror 4, and the mirrors 10a and 10b form a reflective multilayer for effectively reflect the EUV light, and become at high temperature during exposure since they absorb the radiant energy from the high-temperature plasma 2. Therefore, they are made of a material with high thermal conductivity, such as metal, and have cooling means (not shown), such as water cooling, for continuous cooling during exposure.

Although not described specifically, a reflective surface of each mirror in the optical system forms a reflective multilayer to effectively reflect the EUV light, and the mirror can be made of a material with high thermal conductivity, such as metal, as required.

The EUV light 10' that has been converted into approximately parallel light enters the integrator 11a that has plural reflective cylindrical mirrors, and the plane mirror 11b and the rotational paraboloid mirror 11c condense, into an arc shape, divergent beams divided by each cylindrical surface, thereby forming an arc illuminated area that has uniform light intensity distribution on the opening in the arc slit 12.

A detailed description will now be given of how the integrator 11a uniformly illuminates the arc area, with reference to another figure.

Figure 3A:
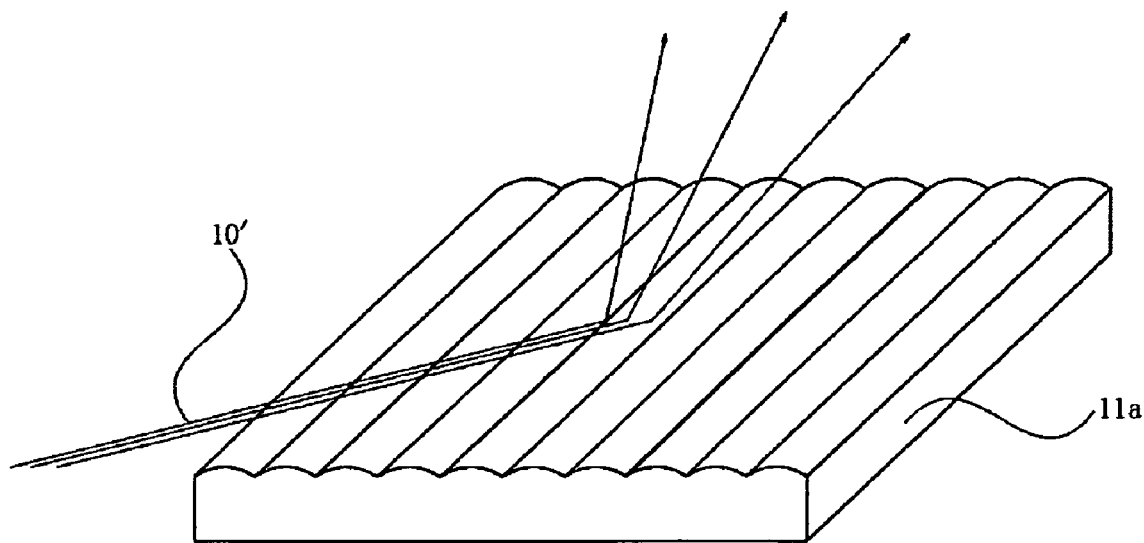
FIG. 3A is a schematic view of a reflection integrator having plural convex cylindrical surfaces.
Figure 3B:
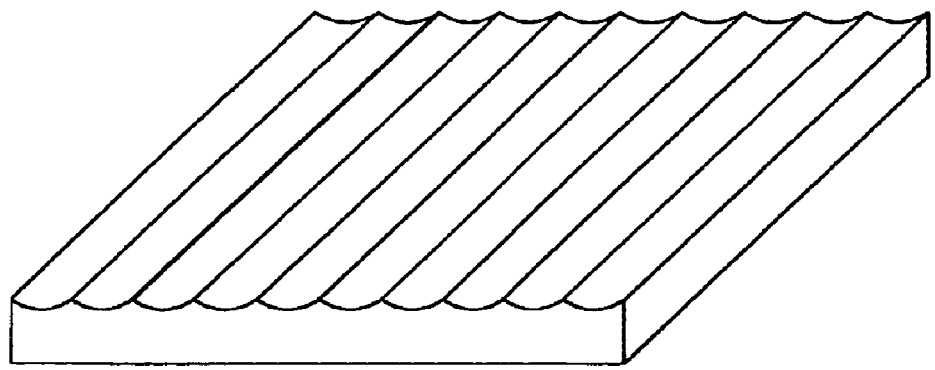
FIG. 3B is a schematic view of a reflection integrator having plural concave cylindrical surfaces.

FIG. 3A is a typical perspective view of the reflection convex cylindrical integrator 11a having plural convex cylindrical surfaces which receives parallel light, and the approximately parallel EUV light 10' enters in the illustrated direction. FIG. 3B is a typical perspective view of a reflection concave cylindrical integrator having plural concave cylindrical surfaces that exhibit similar effects to FIG. 3A. The integrator 11a in FIG. 1 is a reflection convex cylindrical integrator, as shown in FIG. 3A, but it may be a reflection concave cylindrical integrator shown in FIG. 3B or a combination thereof.

Figure 4:
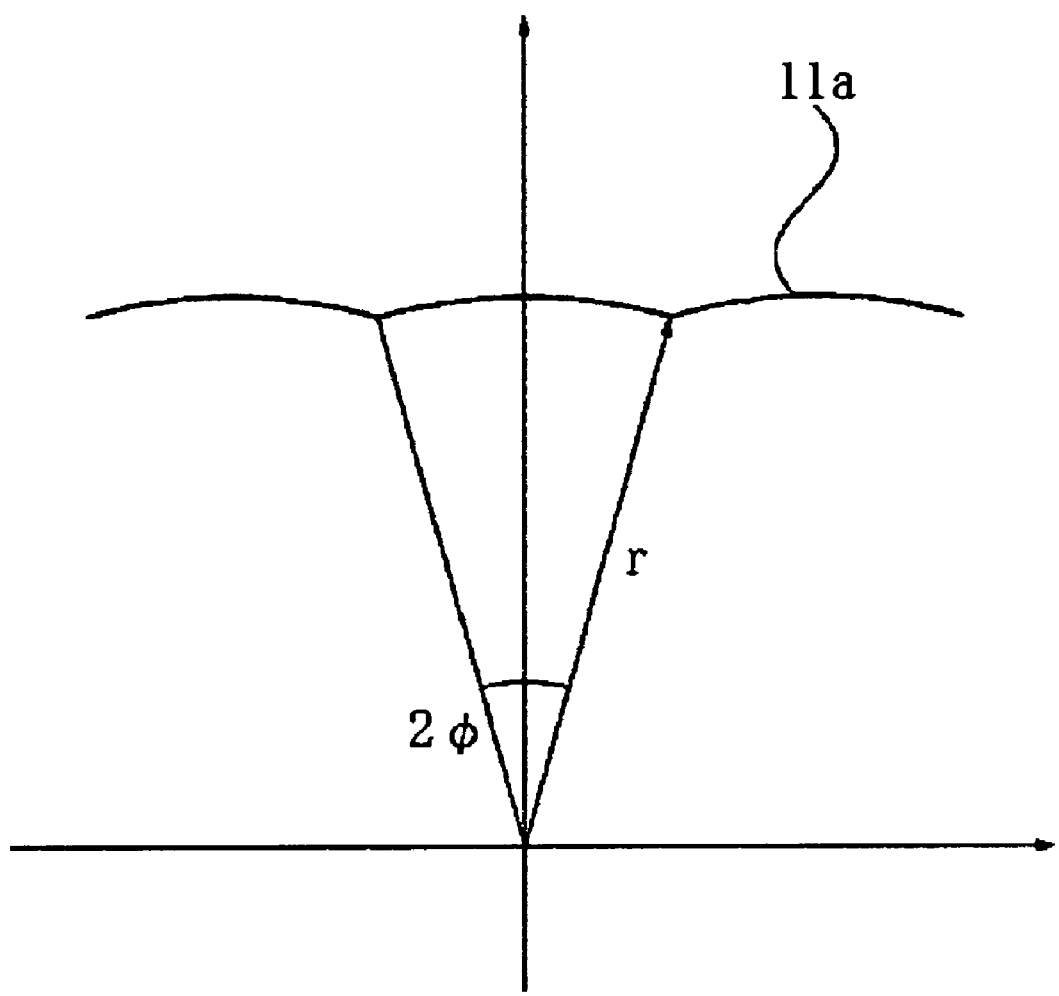
FIG. 4 is a view of a sectional shape of the integrator.
Figure 5:
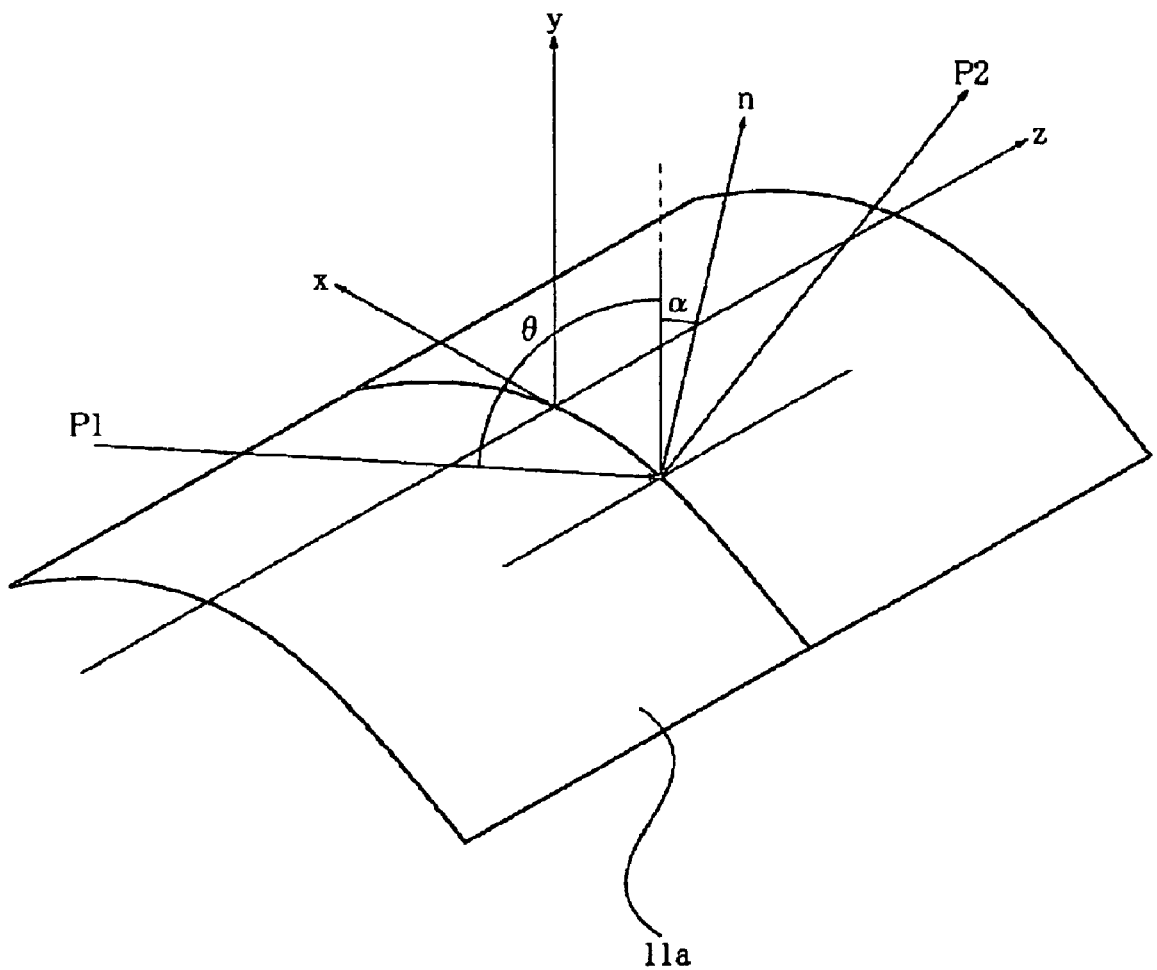
FIG. 5 is a view for explaining an angular distribution of light reflected on a cylindrical surface.
Figure 6:
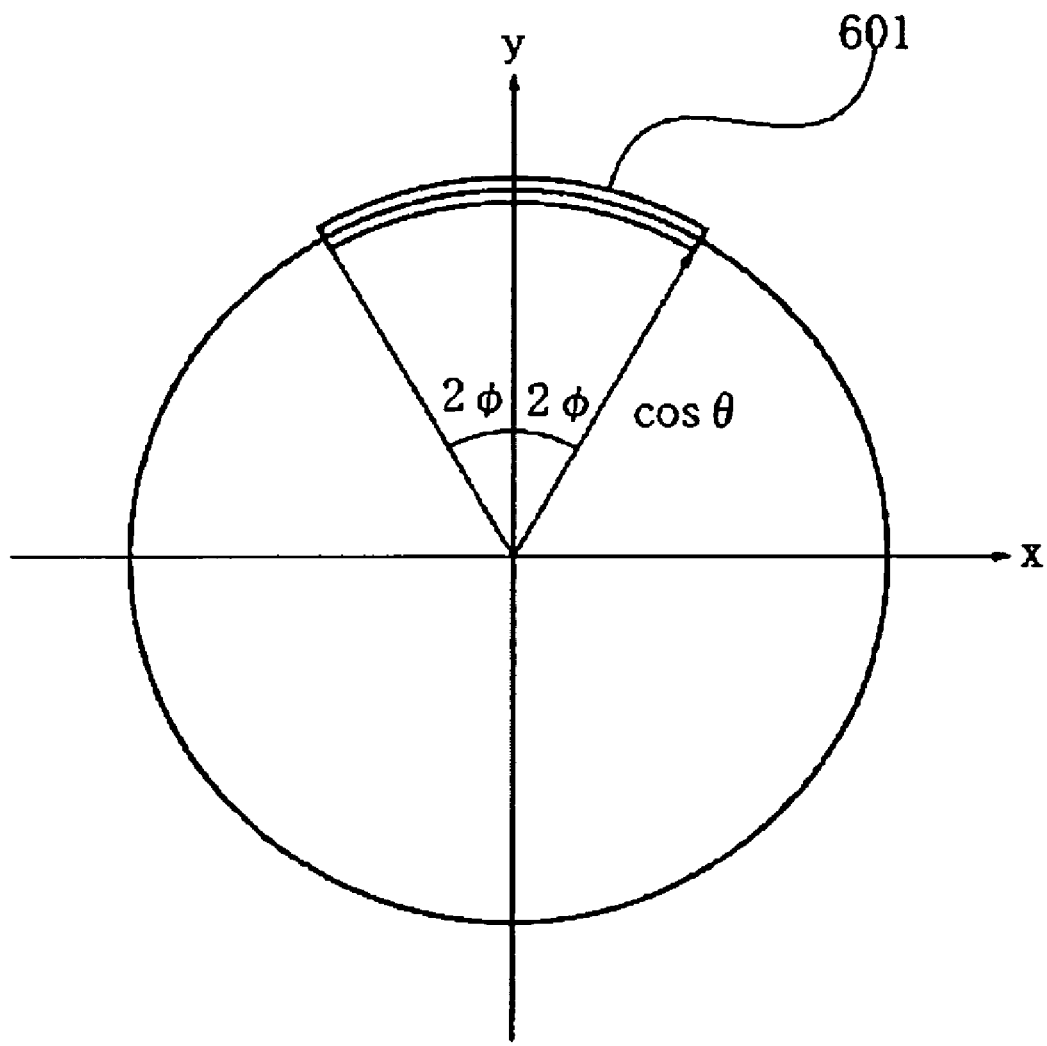
FIG. 6 is a view showing an arc area formed by the light reflected on the cylindrical surface.

FIG. 4 is a typical sectional view of the reflection convex cylindrical integrator, FIG. 5 is a view for explaining reflections of the EUV light on the cylindrical surface of the reflection convex cylindrical integrator, and FIG. 6 is an angular distribution diagram of the EUV light reflected the reflection convex cylindrical integrator. In each figure, reference numeral 11a denotes the reflection convex cylindrical integrator.

As shown in FIG. 3A, when approximately parallel EUV light 10' is incident upon the integrator 11a having plural cylindrical surfaces, the secondary light source is formed near the integrator surface and the EUV light radiated from this secondary light source has a cone angular distribution. Then the arc illumination is available by reflecting the EUV light on the mirror that has a focal point at a position of this secondary light source, and illuminating the reflection mask or a surface conjugate with the reflection mask.

In order to explain operations of the reflection integrator having plural cylindrical surfaces, a description will now be given of a behavior of the reflected light when the parallel light is incident upon one cylindrical mirror with reference to FIG. 5. It is now supposed that parallel light is incident upon one cylindrical surface at an angle $\theta$ to a surface perpendicular to the center axis.

When a ray vector of the incident parallel light is defined as $P1=(0, -\cos\theta, \sin\theta)$, and a normal vector on the cylindrical reflective surface is defined as $n=(-\sin\alpha, \cos\alpha, 0)$, the ray vector of the reflected light becomes $P2=(-\cos\theta\times\sin 2\alpha, \cos\theta\times\cos 2\alpha, \sin\theta)$. The plotted ray vector of the reflected light in a phase space forms a circle with a radius of $\cos\theta$ on an xy plane, as shown in FIG. 6. Therefore, the reflected light becomes cone divergent light, and the secondary light source is located on a vertex of this cone surface. When the integrator 11a has a concave cylindrical surface, this secondary light source exists as a real image outside the reflective surface, whereas when the integrator has a convex cylindrical surface, this secondary light source exits as a virtual image inside the reflective surface. As shown in FIG. 4, when the reflective surface is limited to part of the cylindrical surface and has a center angle of $2\Phi$ the ray vector P2 exists as an arc 601 having a center angle of 4Φ on the xy plane as shown in FIG. 6.

Then, suppose a rotational paraboloid mirror having a focal distance f and a focal point at the secondary light source's position that is formed as a result of parallel light incident upon the above cylindrical mirror, and an illuminated surface located apart from this mirror by the distance f. The secondary light source emits the cone divergent light, which is then reflected on the mirror having the focal distance f and then converted into parallel light. The reflected light is a sheet beam having an arc section with a radius f×cos θ and a center angle of 2Φ. Therefore, as shown in FIG. 6, only the arc area 601 is illuminated with a radius of f×cos θ and a center angle of 2Φ on the illuminated surface.

Figure 2:
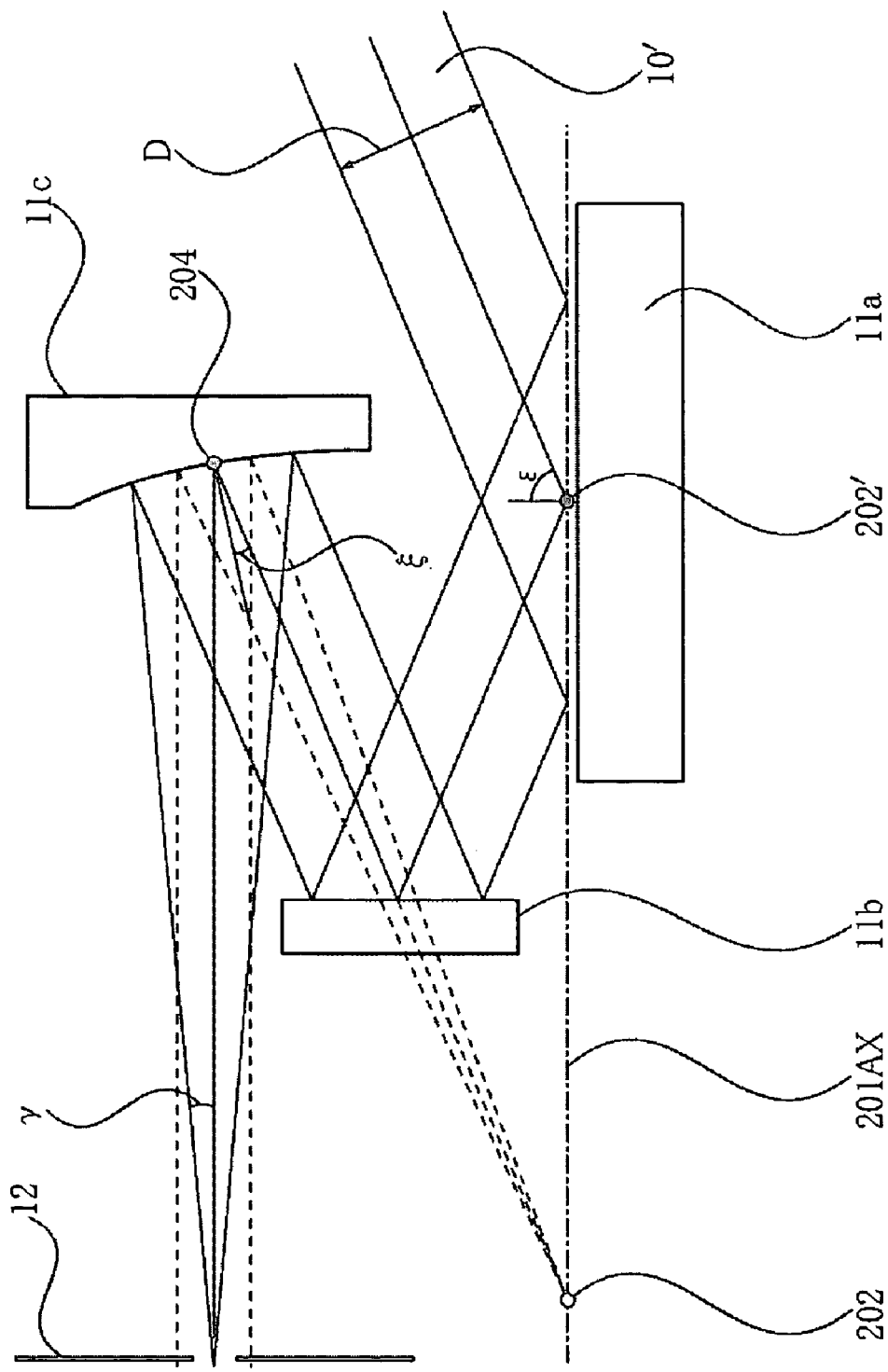
FIG. 2 is a view of an integrator that receives parallel light.

The foregoing description refers to one cylindrical mirror. Referring now to FIG. 2, a description will be given of the integrator 11a that arranges a multiplicity of cylindrical surfaces in parallel on a large area, and receives the parallel light 10' with a certain beam diameter in a direction shown in FIG. 1.

In FIG. 2, 11a is the above integrator, 11b is a plane mirror, 11c is a rotational paraboloid mirror, and 12 is a slit having an arc opening. The rotational paraboloid mirror 11c is a mirror that is centrically symmetrical around a shaft 201AX, and has a reflective surface that is part of a surface formed by rotating a paraboloid having a focal point 202 around an axis 201AX. A distance between the focal point 202 and the mirror effective part's center point 204 is the focal distance f. A distance between the point 204 and the arc slit 12 is set to be approximately equal to the focal distance f.

The rotational paraboloid mirror 11c is arranged so that its rotational axis 201AX is arranged parallel to the reflective surface on or near the reflective surface of the integrator 11a, and aligned with the cylindrical surfaces. As illustrated, the plane mirror 11b is located between the effective part's center point 204 and the focal point 202 on the rotational paraboloid mirror 11c, the point 202' that is symmetrical to the focal point 202 with respect to the reflective surface of the mirror 11b can be located approximately at a center position of the reflective surface's effective part on the integrator 11a. In other words, an optical path length from the position 204 to the position 202' is equal to the focal distance f.

This arrangement provides the position 202' and the arc slit 12 with a separation by the focal distance f from the rotational paraboloid mirror 11b or a relationship of the Fourier conversion surface. Therefore, the approximately parallel EUV light 10' incident upon the integrator 11a as illustrated is condensed at or near the opening of the arc slit 12.

The EUV light to the rotational paraboloid mirror 11c has a low incident angle ξ of the primary ray between 0° and 45°, more specifically, 20°. Thereby, the defocus amount reduces when light is condensed in the arc slit 12 and condensing efficiency improves near the arc opening rather than the high incident angle. Thereby, the optical loss due to shielding reduces, and the illumination system's efficiency improves.

Since the light reflected on the mirror that arranges plural cylindrical surfaces in parallel has the same angular distribution as the above, the arc area is illuminated with a radius f×cos ε near the arc slit 12, where ε is a light incident angle to the integrator 11a. Since the light incident upon one point near the arc slit 12 results from the entire illuminated area that arranges plural cylindrical surfaces in parallel, the angular range γ, i.e., condensing NA, becomes γ=D/f, where D is a beam diameter of the approximately parallel EUV light 10'.

In this case, the arc illuminated area maintains uniform light intensity since the multiple cylindrical surfaces on the integrator 11a superimpose the light. In other words, this can achieve effective and uniform arc illumination.

Turning back to FIG. 1, a description will be given of the exposure apparatus of the instant embodiment. As illustrated, the masking blade 13 partially restricts the arc illuminated area formed near the opening in the arc slit 12, and the masking imaging system 14 enlarges or reduces the arc illuminated area at a desired magnification. As a consequence, the reflection mask 16 is illuminated with an arc shape by introducing the arc illuminated area at a desired incident angle into the reflection mask 16 held by the mask stage 17. The center of curvature of the arc illuminated area accords with the optical axis 18AX of the projection optical system 18.

The circuit pattern is exposed when the projection optical system 18 projects, onto the wafer 19 that applies a photosensitive material, at a magnification suitable for exposure, the reflected EUV light having circuit pattern information from the reflection mask 16 that has been illuminated in an arc shape.

The above wafer is fixed on the wafer stage 20, which serves to provide back and forth and up and down parallel movements on the paper surface under control of distance measuring equipment, such as a laser interferometer (not shown). The scan exposure over the entire surface requires, for example, the reflection mask 16 to be scanned at a speed v in a direction parallel to the paper surface and the wafer 19 to be simultaneously synchronously scanned at a speed v/M in the direction parallel to the paper, where M is a magnification of the projection optical system 18.

The projection optical system 18 is comprised of plural multilayer reflective mirrors, and provided with excellent imaging performance in an off-axis, thin arc area. The projection optical system 18 is configured to project a reduced size of the pattern on the mask 16 onto the wafer 19 surface, and form an image-side (or wafer-side) telecentric system.

The projection optical system 18 provides an object side (or the reflection mask side) with a non-telecentric structure so as to avoid physical interference with the illumination light incident upon the reflection mask 16, and the instant embodiment inclines the image-side principal ray, for example, by about 6.degree. relative to the normal direction of the mask 16.

A detailed description will now be given of (1) scan exposure using the arc illumination, (2) a method of correcting uneven exposure by using the arc slit 12, (3) operations of the masking blade 13 during the scan exposure, and (4) a structure of a masking imaging system in this order.

Figure 7A:
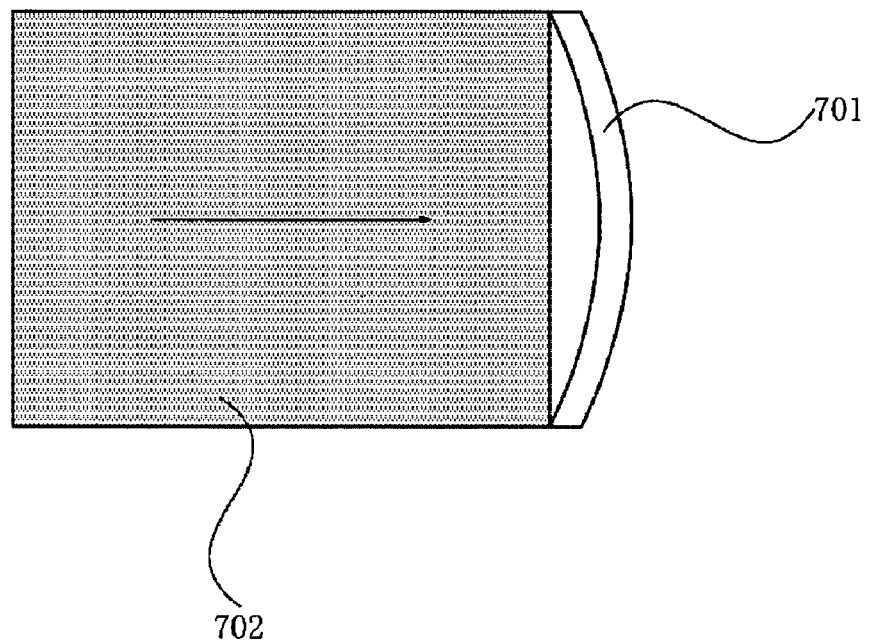
FIG. 7A is a view in a scan exposure start state.
Figure 7B:
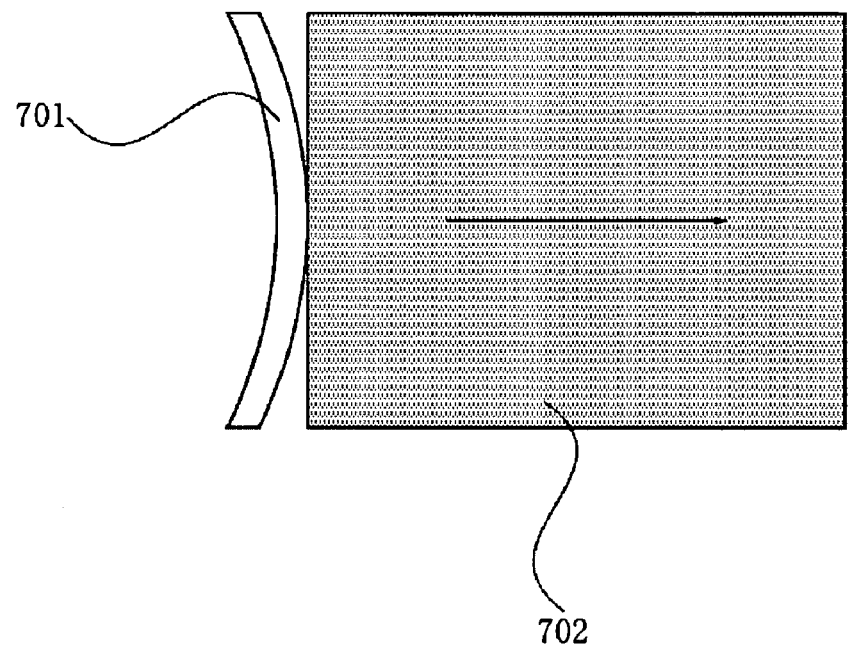
FIG. 7B is a view in a scan exposure end state.
Figure 8:
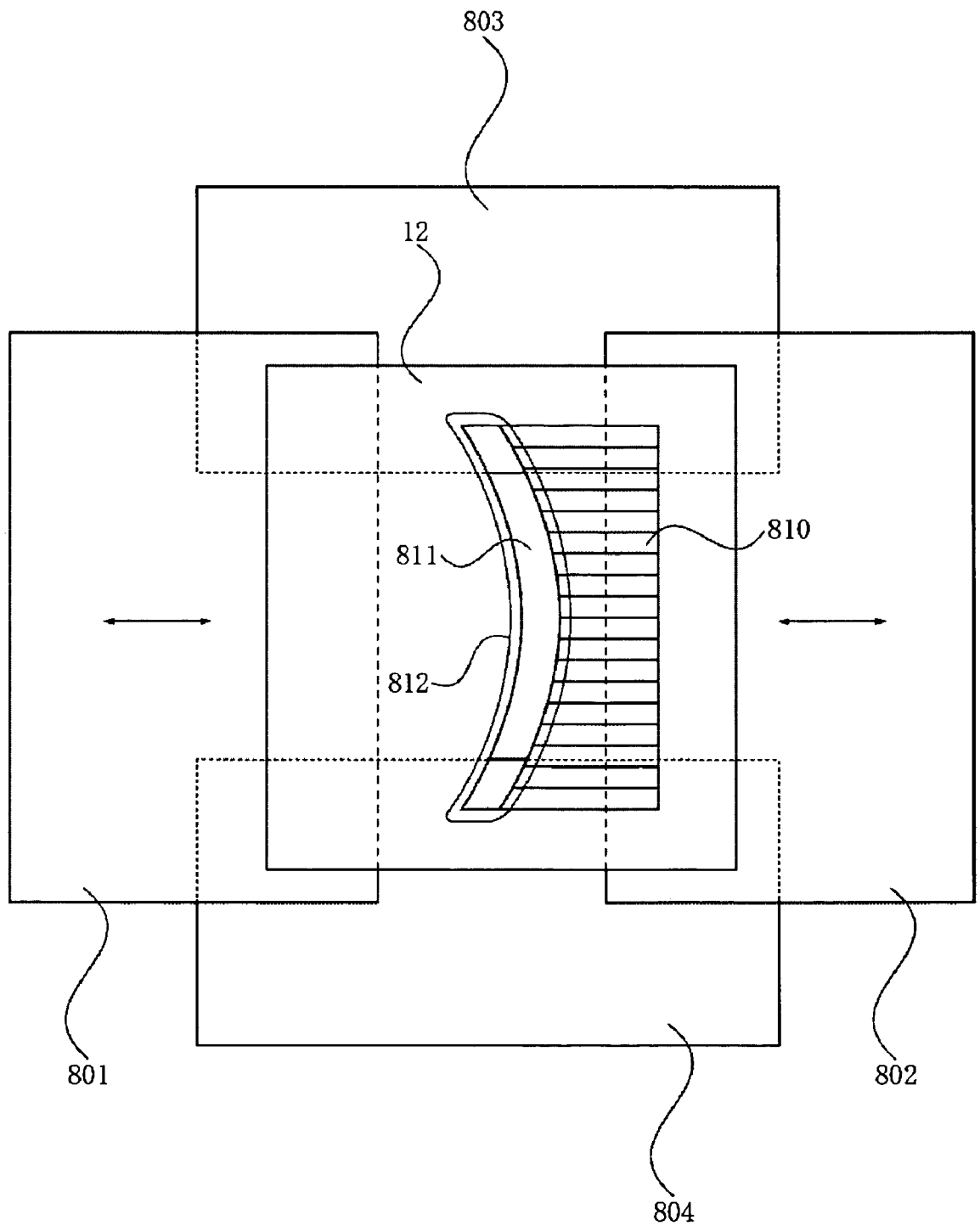
FIG. 8 is a schematic view of a variable arc slit and a masking blade.

FIGS. 7A and 7B show scan exposure start and end states on the wafer surface, respectively. As illustrated, 701 denotes an arc illuminated area on the wafer surface. 702 denotes an exposed area as an object to be exposed. In this figure, the exposure area 702 moves from left to right on the paper when the wafer stage is driven. The arc illuminated area 701 is configured to relatively scan the exposed area 702. The masking blade works so that the arc illuminated area 701 is prevented from illuminating part except for the exposure area 702 at the exposure start and exposure end. This will be described in the operation of the masking blade.

The above is applicable to scan exposure in a relatively reverse direction to the scanned direction in this embodiment.

A detailed description will be given of a method of correcting an uneven exposure with the arc slit 12 in the above scan exposure. As illustrated, 810 denotes a multiple movable edges for partially changing a slit width 811 in the arc slit 12. 811 denotes a slit opening for forming the arc illuminated area. 812 denotes an arc illuminated area formed by the above integrator 11a and mirror system 11b and 11c, and this illuminated area defines light that passes through the slit opening 811.

The uneven exposure occurs if there is uneven light intensity in the arc slit when the scan exposure transfers a reduced size of the circuit pattern in the reflection mask 16 onto the wafer 19. One solution for this problem uses a drive system (not shown) to move the movable edges 810 to narrow only the slit width that provides relatively strong light intensity in the arc slit, and to reduce the light amount for the scan exposure by a desired amount. As a result, exposure with uniform intensity is available on the entire exposed surface as a result of accumulation.

The masking blade 13 includes four light-shielding plates 801, 802, 803 and 804, the upper and lower light-shielding plates 803 and 804 shield light at both ends of the arc illuminated area 812 in the arc slit opening 811, and define a longitudinal width (or a scan width) of the exposed area 702 shown in FIG. 7A.

The light-shielding plates 801 and 802 define a lateral width (or a scan length) in the exposed area 702 by moving in a lateral direction and opening and closing an aperture from the exposure start to the exposure end for one shot in the scan exposure, as described in detail below, with reference to FIG. 9.

Figure 9:
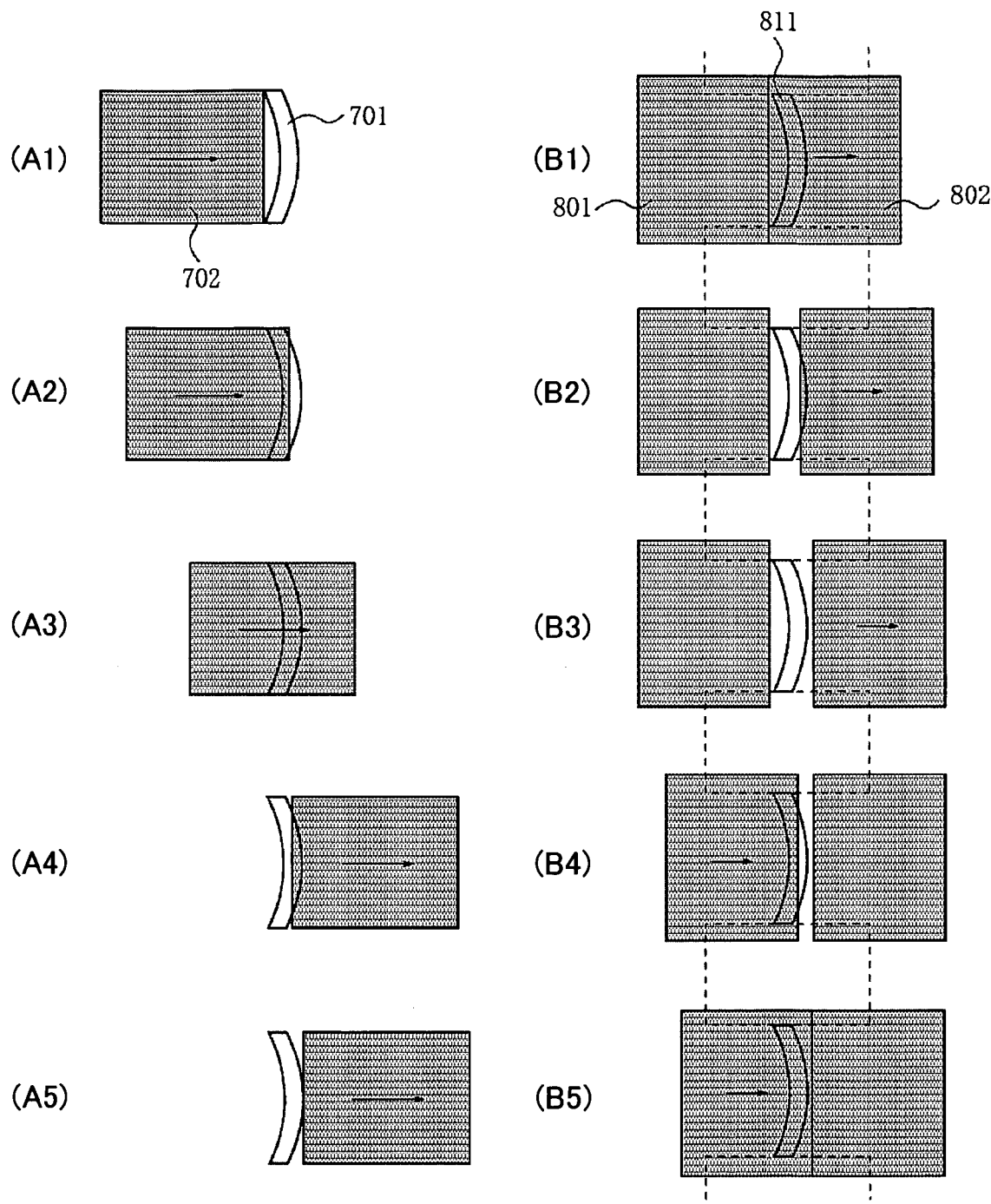
FIG. 9 is a view showing actions of the masking blade during scan exposure.

In FIG. 9, (A1) to (A5) time-sequentially represent scan exposure from a start to an end, while (B1) to (B5) show actions of light-shielding plates 801 and 802 in the masking blade 13 at states (A1) to (A5).

The exposure is about to start at the state (A1), and the light-shielding plate 802 starts to move to the right at the state (B1) to open the aperture. The arc illuminated area 701 is light-shielded in this state, and not actually illuminated although illustrated. When the scan exposure starts as shown in (A2), the light-shielding plate 802 moves as shown in the state (B2) so as to light-shield a projection the arc illuminated area 701 from the exposure area 702. As shown in (B3), the arc illuminated area 701 moves within the exposed area 702 for scan exposure, the light-shielding plate 802 moves to the right as shown in (B3) to completely open the slit opening 811. When the scan exposure nearly ends as shown in (A4), the light-shielding plate 801, in turn, moves to the right so as to light-shield a projection of the arc illuminated area 701 from the exposed area 702. When the scan exposure ends as shown in (A5), the light-shielding plate 801 moves and completely shields the slit opening 811. The above series of actions provides the scan exposure for a desired exposed area.

Figure 10:
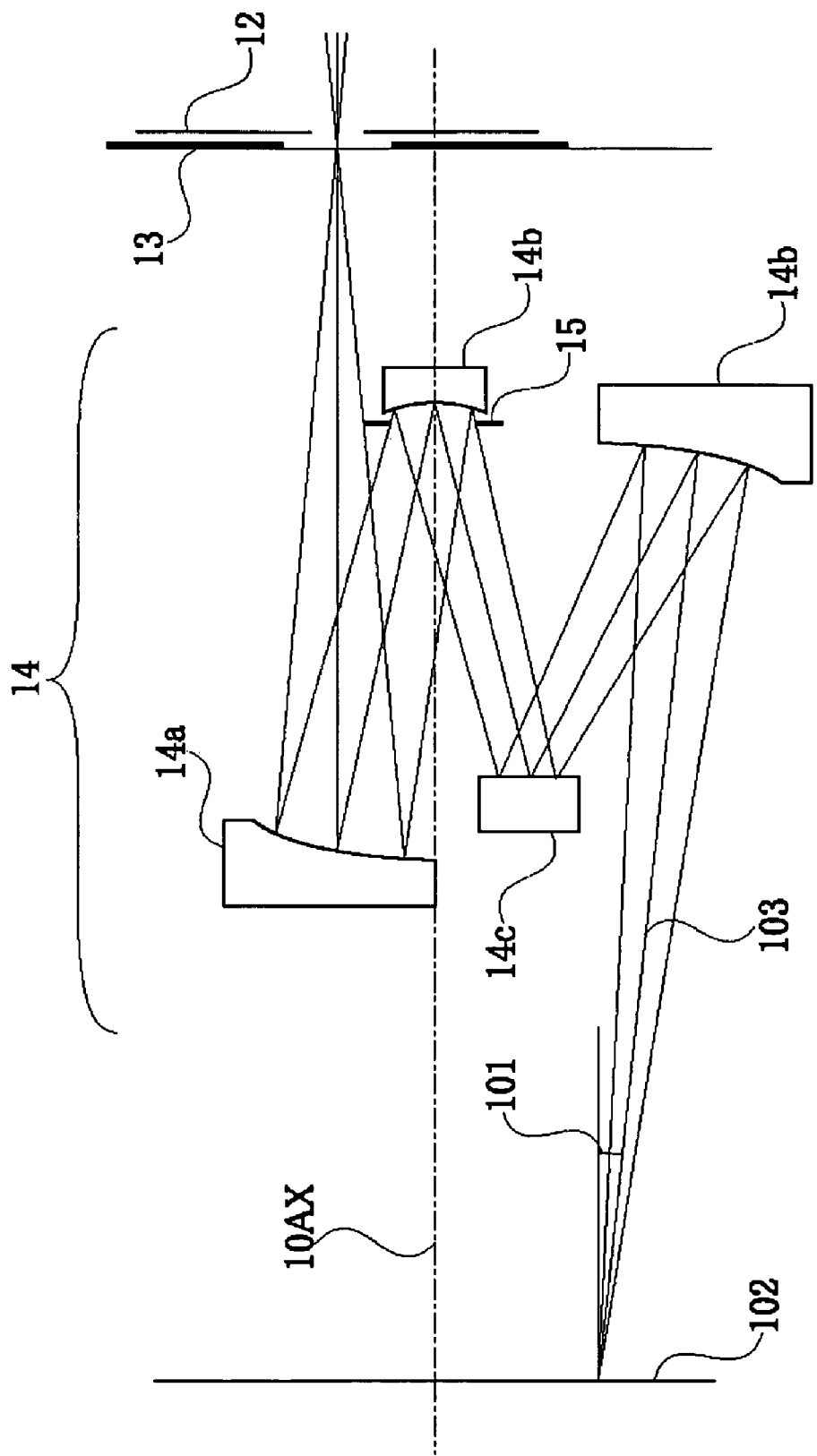
FIG. 10 is a schematic view of a masking imaging system.
Figure 11A:
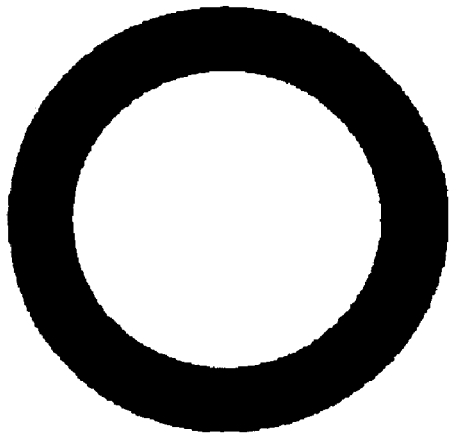
FIG. 11A is a view showing an aperture stop corresponding to a large a mode in a normal illumination.
Figure 11B:
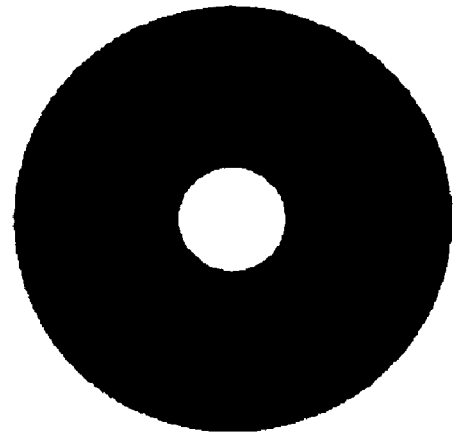
FIG. 11B is a view showing an aperture stop corresponding to a small a mode in a normal illumination.
Figure 11C:
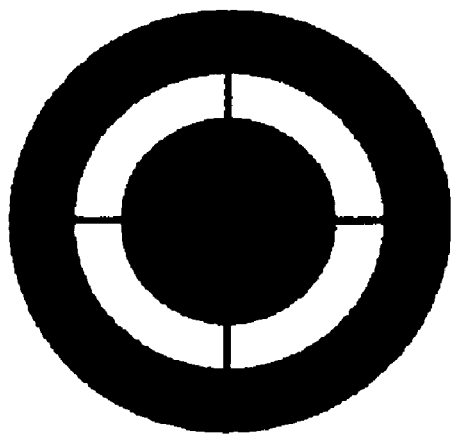
FIG. 11C is a view showing an aperture stop corresponding to an annular illumination mode.
Figure 11D:
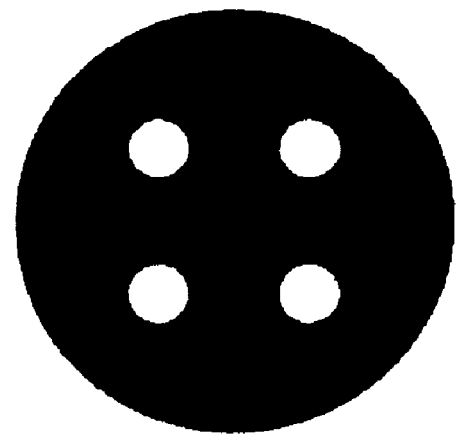
FIG. 11D is a view showing an aperture stop corresponding to a quadrupole illumination mode.
Figure 12:
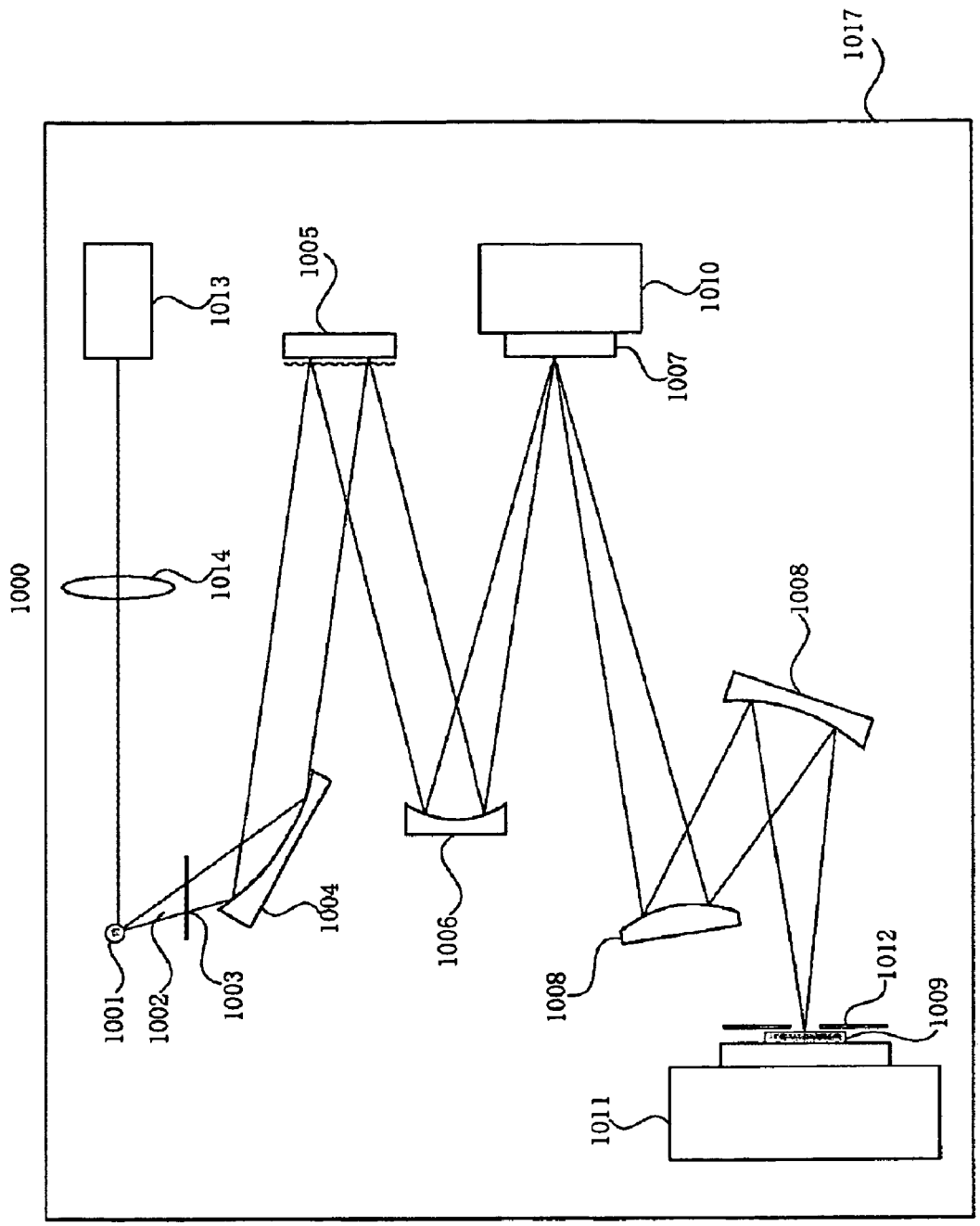
FIG. 12 is a schematic view of a prior art illustration.
Figure 13:
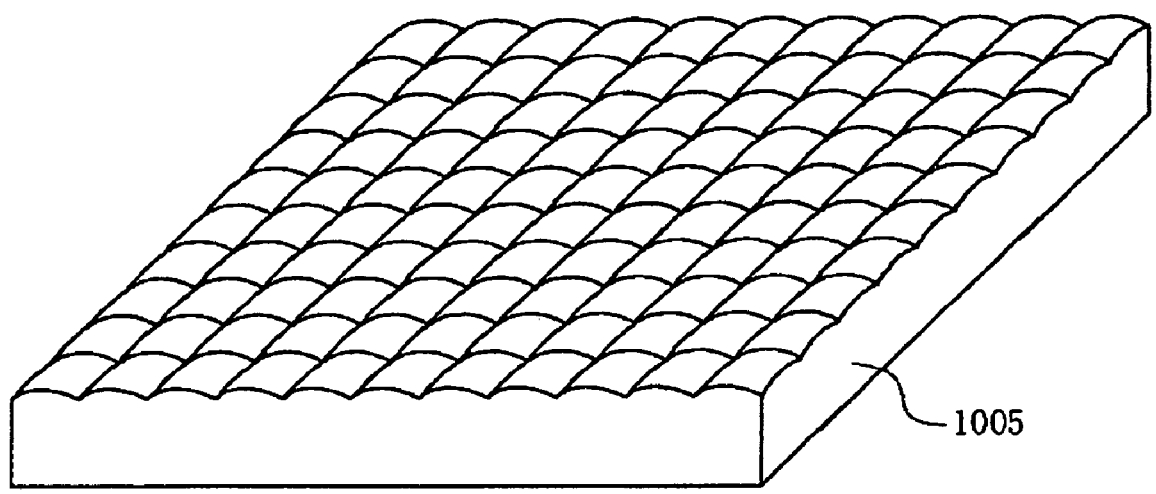
FIG. 13 is a schematic perspective view of a conventional reflection integrator.
Figure 14:
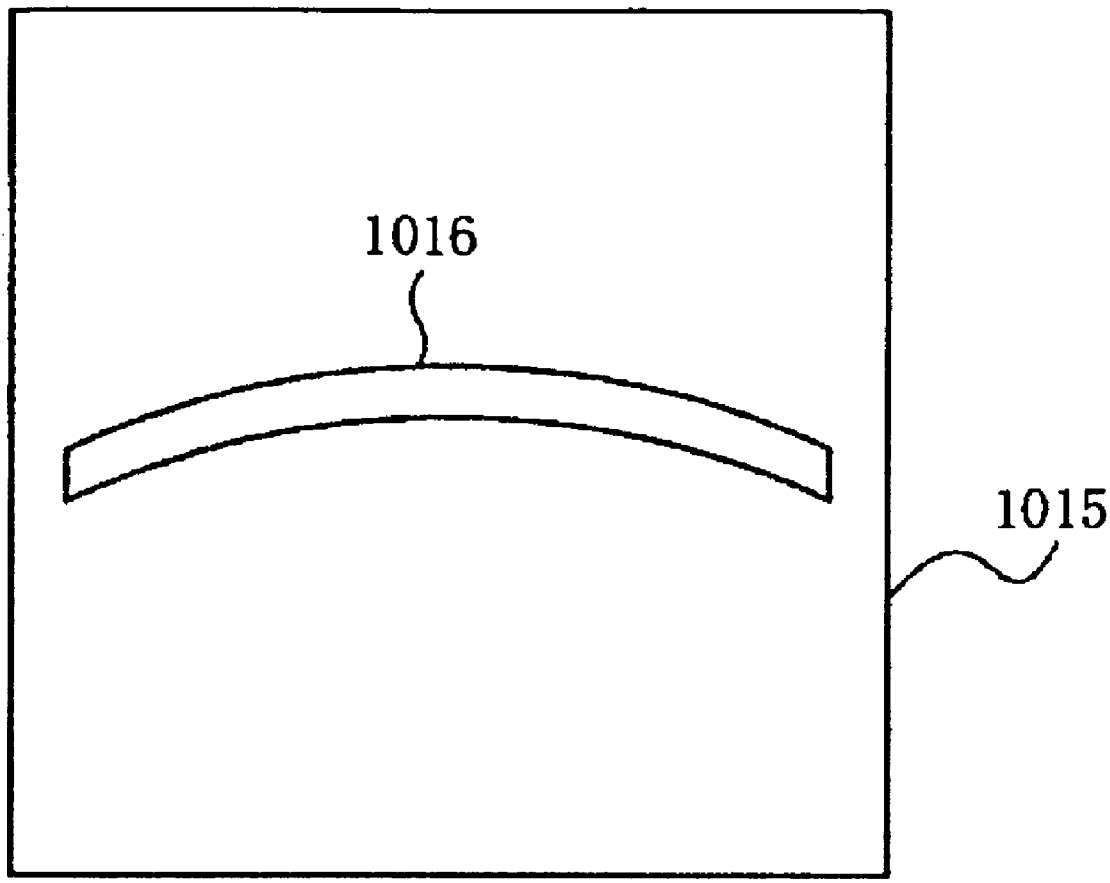
FIG. 14 is a view of a conventional illuminated area and an arc area to be exposed.

Next follows a detailed description of the masking imaging system 14 with reference to FIG. 10. The masking imaging system 14 is an imaging optical system that uses the above masking blade 13 as an image surface, and a reflection mask (not labeled, at a position 102 in the figure) as an image surface, and includes reflective multilayer mirrors. This imaging system is a coaxial optical system that serves to image and form an arc illuminated area suitable for the projection optical system 18 by applying a desired magnification to the object-side arc area that arranges the common axis (or optical axis) 10A nearly at a center.

As illustrated, 14a, 14b, 14c and 14d are concave or convex spherical or aspheric mirrors that use the center axis 10AX for rotational symmetry, and are concave, concave, convex and concave from 14a in the instant embodiment. The pupil surface in the masking imaging system 14 is located on or near the reflective surface of the mirror 14b, at which the aperture stop 15 is located. The aperture stop 15 changes its opening pattern to change a convergent angle (or a so-called coherence factor σ) of the illumination light at the reflection mask side, or to provide modified illumination, as described in detail below:

The EUV light condensed at a position of the masking blade 13 arranged near the arc slit 12 enters the masking imaging system 14 while the principal ray is parallel to or object-side telecentric to the rotationally symmetrical axis 10AX. The incident light condenses into the image surface 102 through the above four mirrors and aperture stop 15. Notably, the image side has a non-telecentric structure, and an incident angle 101 upon the image surface 102 of the principal ray 103 (or an angle between the principal ray 103 and the rotationally symmetrical axis 10AX) is set to be approximately equal to the inclination angle of the object-side principal ray of the projection optical system 18 to the mask-surface normal. In other words, an angle between the mask-side principal ray of the imaging system 14a to 14d and the rotationally symmetrical axis 10AX, corresponding to each position on the reflection mask's illuminated area is set to be approximately equal to an angle between the mask-side principal ray of the projection optical system and the normal to the mask surface. The instant embodiment sets the incident angle 101 to be about 6°, equal to the angle between the mask-side principal ray of the projection optical system 18 and the normal to the mask surface. Since the optical axis of the projection optical system is parallel to the normal to the mask surface, an angle between the optical axis of the projection optical system and the mask-side principal ray of the projection optical system 18. Therefore, the angle between the mask-side principal ray of the imaging system and the optical axis of the imaging system is approximately equal to the angle between the angle between the mask-side principal ray of the projection optical system and the normal to the mask surface. The imaging surface properly corrects defocus at the image side, and the spot diameter on the image surface is designed to be 5 mm or smaller, preferably 1 mm or smaller.

When the plane mirror 14e reflects the image-side light 14' of the masking imaging system 14 shown in FIG. 1 and angles it toward the reflection mask 16, an orientation of an arc illuminated area formed by the light 14' is reversed and the arc's center accords with an intersection between the center axis 18AX of the projection system 18 and the reflection mask. The above incident angle 101 enables the principal ray of the light 14' to approximately accord with the principal ray of the object-side light 18' of the projection optical system 18 with respect to a reflective surface on the reflection mask.

A description will now be given of a method for varying a coherent factor σ and for providing a modified illumination, such as annular illumination, by switching the aperture stop 15 in the masking imaging system 14. The aperture stop 15 (or a pupil surface in the masking imaging system) and the pupil surface of the projection optical system 18 are conjugate with each other. Therefore, an opening pattern or a light transmission pattern in the aperture stop 15 corresponds to a light-source image on the projection optical system's pupil surface or an effective light source distribution. FIGS. 11A to 11D are views of exemplary opening shapes of the aperture stop 15. A stop in FIG. 11A has a circular opening and corresponds to a large a mode in a normal illumination. A stop in FIG. 11B has a circular opening smaller than the stop in FIG. 11A and corresponds to a small σ mode in a normal illumination. A stop in FIG. 11C has an annular opening and corresponds to the annular illumination mode. A stop in FIG. 11D has four openings and corresponds to the quadrupole illumination mode.

It is possible to switch to a desired opening shape by preparing several opening patterns, for example, on a turret, and by rotating this turret using an aperture stop drive system (not shown). Instead of using the turret, other mechanical methods may be used, such as switching of plural aperture stops that are linearly arranged or use of an iris stop.

Second Embodiment

Figure 15:
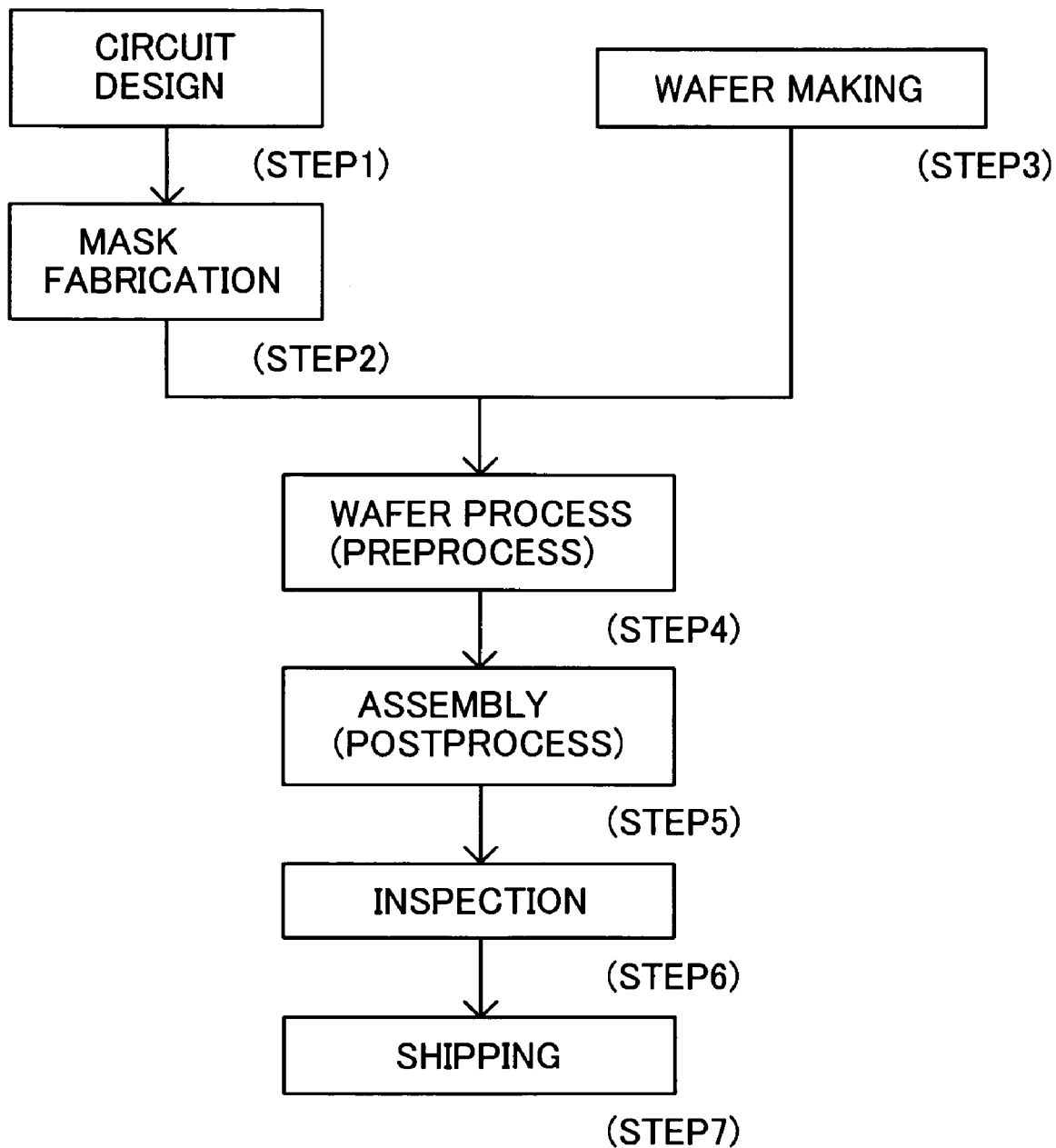
FIG. 15 is a flowchart for explaining a method for fabricating devices (semiconductor chips such as ICs, LSIs, and the like, LCDs, CCDs, etc.).

A description will now be given of an embodiment of a device fabricating method using the exposure apparatus of the first embodiment. FIG. 15 is a manufacture flow for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 16:
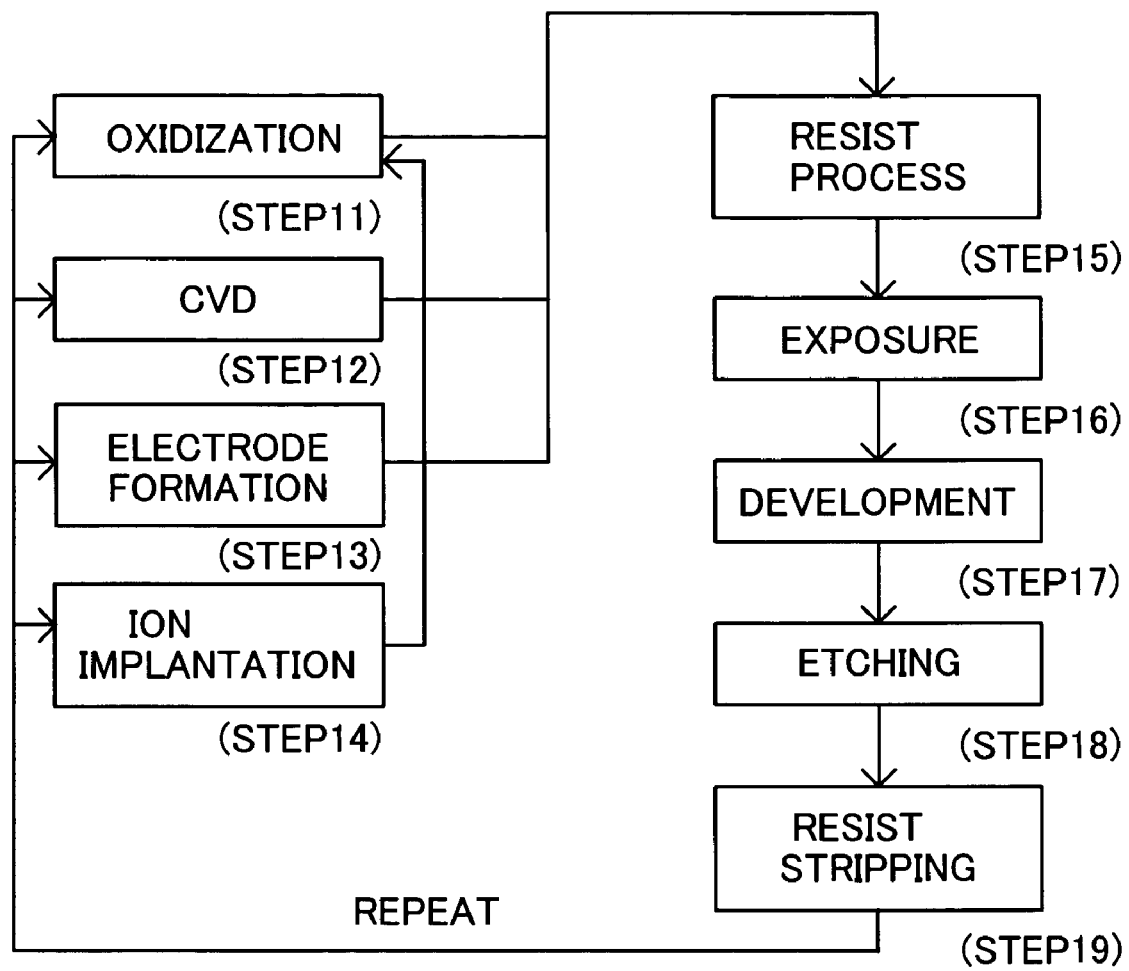
FIG. 16 is a detailed flowchart for Step 4 of wafer process shown in FIG. 15.

FIG. 16 is a detailed flow of the above wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus of the first embodiment to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and a circuit pattern is formed on the wafer.

Use of the manufacture method of the instant embodiment would be able to manufacture highly integrated devices, which have been difficult to be manufactured.

While the above embodiments describe the illumination system that uses the EUV light of 13.5 nm, the present invention is applicable to another illumination optical system that uses different light, for example, light in an EUV or E-ray region with a wavelength between 10 nm and 200 nm. No glass material is applicable as a lens for light with a wavelength between 20 and 50 nm, and the optical system should include mirrors only. Therefore, the present invention is effectively applicable to the illumination optical system that uses this region.

As many apparently widely different embodiments of the present invention can be made without departing from the sprit and scope thereof, it is to be understood that the invention is not limited to the specific embodiments thereof except as defined in the claims.

What is claimed is:
1. An exposure apparatus comprising:
   an illumination optical system for illuminating a pattern of a reflection mask, by using light from a light source, wherein said illumination optical system includes:
      a field stop that defines an illuminated area on the reflection mask, and has an opening; and
      an imaging system for directing the light from the opening in the field stop into the reflection mask, the imaging system being a coaxial optical system; and
   a projection optical system for projecting the pattern on the reflection mask onto a substrate, wherein a principal ray of the imaging system at a side of the reflection mask forming an inclination angle to a common axis of the coaxial optical system, the inclination angle being approximately equal to an angle between a principal ray of said projection optical system at the side of the reflection mask and a normal to a surface of the reflection mask.

2. An exposure apparatus according to claim 1, wherein said illumination optical system includes a plane mirror for reflecting light from the imaging system and for introducing the same into the reflection mask.

3. An exposure apparatus according to claim 1, wherein the principal ray of the imaging system at a side of the field stop is approximately parallel to the common axis.

4. An exposure apparatus according to claim 1, wherein said illumination optical system has an aperture stop at a pupil surface in the imaging system.

5. An exposure apparatus according to claim 4, wherein the aperture stop has an opening, and said illumination optical system has a mechanism for changing a size or a shape of the opening in the aperture stop.

6. An exposure apparatus according to claim 1, wherein the field stop includes a masking blade that includes plural light-shielding plates.

7. An exposure apparatus according to claim 1, wherein the field stop includes an arc slit that has an arc opening.

8. An exposure apparatus according to claim 7, wherein the arc opening has a curvature center on the common axis.

9. An exposure apparatus according to claim 1, wherein the field stop includes:
   a masking blade that includes plural light-shielding plates; and
   an arc slit that has an arc opening.

10. An exposure apparatus according to claim 1, wherein said illumination optical system includes:
    a reflection integrator for forming plural secondary light sources using the light from the light source; and
    a mirror system for superimposing light from plural secondary light sources on the field stop and for forming the arc illuminated area, wherein the arc illuminated area has a curvature center on the common axis.

11. An exposure apparatus according to claim 1, wherein the imaging system includes four mirrors.

12. An exposure apparatus according to claim 11, wherein first and fourth mirrors in the four mirrors from the field stop have concave reflective surfaces.

13. An exposure apparatus according to claim 11, wherein a third mirror in the four mirrors from the field stop has a convex reflective surface.

14. An exposure apparatus according to claim 11, wherein a second mirror in the four mirrors from the field stop has a concave reflective surface.

15. An exposure apparatus according to claim 1, wherein the imaging system has a pupil surface, and includes a mirror that has a reflective surface at the pupil surface.

16. An exposure apparatus according to claim 1, wherein the light from the light source has a wavelength of 200 nm or smaller.

17. An exposure apparatus according to claim 16, wherein the light from the light source has a wavelength between 5 nm and 20 nm.

18. A device fabricating method comprising the steps of:

exposing an object using an exposure apparatus; and developing the exposed object, wherein said exposure apparatus includes:

an illumination optical system for illuminating a pattern of a reflection mask, by using light from a light source, wherein said illumination optical system includes:
- a field stop that defines an illuminated area on the reflection mask, and has an opening; and
- an imaging system for directing the light from the opening in the field stop into the reflection mask, the imaging system being a coaxial optical system; and a projection optical system for projecting the pattern on the reflection mask onto a substrate, wherein a principal ray of the imaging system at a side of the reflection mask forming an inclination angle to a common axis of the coaxial optical system, the inclination angle being approximately equal to an angle between a principal ray of said projection optical system at the side of the reflection mask and a normal to a surface of the reflection mask.

* * * * *